United States Patent
Delamare et al.

(10) Patent No.: US 10,064,238 B2
(45) Date of Patent: Aug. 28, 2018

(54) POWER SOCKET TERMINAL NETWORK, TERMINAL AND METHOD

(71) Applicant: En-Twyn Limited, London (GB)

(72) Inventors: Andrew Delamare, London (GB); James Gardiner, London (GB)

(73) Assignee: EN-TWYN LIMITED, London (GB)

( * ) Notice: Subject to any disclaimer, the term of this patent is extended or adjusted under 35 U.S.C. 154(b) by 0 days.

(21) Appl. No.: 14/907,238

(22) PCT Filed: Jul. 23, 2014

(86) PCT No.: PCT/GB2014/052240
§ 371 (c)(1),
(2) Date: Jan. 22, 2016

(87) PCT Pub. No.: WO2015/011465
PCT Pub. Date: Jan. 29, 2015

(65) Prior Publication Data
US 2016/0165660 A1    Jun. 9, 2016

(30) Foreign Application Priority Data

Jul. 24, 2013 (GB) .................................. 1313212.1
Nov. 18, 2013 (GB) .................................. 1320350.0

(51) Int. Cl.
*H04B 5/00* (2006.01)
*H04B 7/00* (2006.01)
(Continued)

(52) U.S. Cl.
CPC ............ *H04W 84/20* (2013.01); *G01R 21/00* (2013.01); *H04B 3/54* (2013.01); *H04B 5/0056* (2013.01);
(Continued)

(58) Field of Classification Search
CPC ...................................................... H04W 84/20
(Continued)

(56) References Cited

U.S. PATENT DOCUMENTS 5,920,615 A *  7/1999  Nolde ................... H04M 1/677
                                                            379/142.13
8,576,929 B2  11/2013  Abad Molina et al.
(Continued)

FOREIGN PATENT DOCUMENTS

CN          102044805 A    5/2011
CN          202159234 U    3/2012
(Continued)

OTHER PUBLICATIONS

International Search Report and Written Opinion dated Jan. 14, 2015 in related PCT Application No. PCT/GB2014/052240 (15 pgs).

(Continued)

*Primary Examiner* — Tilahun B Gesesse
(74) *Attorney, Agent, or Firm* — Maschoff Brennan

(57) ABSTRACT

A power socket terminal network, comprising: at least one power socket stave terminal, having: at least one power socket coupled to a power line, for providing power to a device; a switch for turning said at least one power socket on and off; a wireless communication module, for providing wireless communications; and at least one power socket master terminal, having: at least one power socket coupled to a power line, for providing power to a device; a switch for turning said at least one power socket on and off; a power line communications module, for providing power line communications via said power line; and a wireless communications module, for providing wireless communications; wherein said at least one power socket slave terminal is arranged to communicate wirelessly, using said wireless (Continued)

communications module, with said at least one power socket master terminal.

7 Claims, 9 Drawing Sheets

(51) Int. Cl.
    *H04M 1/00*     (2006.01)
    *H04W 84/20*     (2009.01)
    *H04B 3/54*     (2006.01)
    *G01R 21/00*     (2006.01)

(52) U.S. Cl.
    CPC ............... *H04B 2203/5441* (2013.01); *H04B 2203/5454* (2013.01); *H04B 2203/5458* (2013.01)

(58) Field of Classification Search
    USPC ..................................... 455/41.1, 41.2, 574
    See application file for complete search history.

(56) References Cited

U.S. PATENT DOCUMENTS

| | | | |
|---|---|---|---|
| 9,419,688 B2 | 8/2016 | Washiro | |
| 9,896,045 B2* | 2/2018 | Hoyer | H04W 4/70 |
| 2004/0268194 A1* | 12/2004 | Kao | G01R 31/317 |
| | | | 714/724 |
| 2006/0126617 A1 | 6/2006 | Cregg et al. | |
| 2009/0150509 A1* | 6/2009 | Chang | G06F 1/3203 |
| | | | 709/208 |
| 2010/0164284 A1* | 7/2010 | Lee | G06F 1/266 |
| | | | 307/38 |
| 2011/0080046 A1* | 4/2011 | Lee | G06F 1/26 |
| | | | 307/39 |
| 2013/0063255 A1 | 3/2013 | Washiro | |

FOREIGN PATENT DOCUMENTS

| | | |
|---|---|---|
| CN | 202434811 U | 9/2012 |
| CN | 102 854 834 A | 1/2013 |
| CN | 102854834 | 1/2013 |
| CN | 102857257 A | 1/2013 |
| CN | 103081368 A | 5/2013 |
| GB | 2450904 | 1/2009 |
| GB | 2490738 | 11/2012 |
| JP | 2011 061972 A | 3/2011 |
| JP | 2011061972 A | 3/2011 |
| JP | 2011243496 A | 12/2011 |
| JP | 5148009 B1 | 2/2013 |
| JP | 2014023293 | 2/2014 |
| WO | 2008090341 A2 | 7/2008 |

OTHER PUBLICATIONS

UK Search Report dated May 8, 2014 in application No. GB1320350.0.
China Office Action dated Apr. 21, 2017 in application No. 201480047175.6.
Uk Examination Report dated Oct. 27, 2016 in application No. GB1320350.0.
European Search Report dated Apr. 5, 2018 in application No. 17201399.7.

* cited by examiner

POWER SOCKET TERMINAL NETWORK, TERMINAL AND METHOD

The present invention relates to a power socket terminal network, a terminal and a method.

BACKGROUND TO THE INVENTION

Power line communications networks are ones in which data signals are sent over power lines. Various systems exist for use in the home and office environment. For example, HomePlug is the name of a family of standards aimed at providing additional networking in the home environment. The present applicant has disclosed details of two such systems in UK Patent Application Publication Nos. GB 2,450,904 A and GB 2,490,738 A.

One of the problems with widespread adoption of power line communications terminals is their cost and complexity. Installing a power line-based socket terminal in every wall box can be expensive. Furthermore, in environments such as offices, some wall boxes are not on the same network, making power line communications impossible.

There is a need for improvements in and relating to power socket terminal networks to address the aforementioned problems. The present application provides details of such improvements.

SUMMARY OF THE INVENTION

In a first aspect, the present invention provides a power socket terminal network, comprising: at least one power socket slave terminal, having: at least one power socket coupled to a power line, for providing power to a device; a switch for turning said at least one power socket on and off; a wireless communication module, for providing wireless communications; and at least one power socket master terminal, having: at least one power socket coupled to a power line, for providing power to a device; a switch for turning said at least one power socket on and off; a power line communications module, for providing power line communications via said power line; and a wireless communications module, for providing wireless communications; wherein said at least one power socket slave terminal is arranged to communicate wirelessly, using said wireless communications module, with said at least one power socket master terminal.

Thus, such a network enables communications to be carried out with all terminals in a building, even if those terminals are on a different power line circuit to the master terminal. Master terminals that are on the same circuit may communicate using power line communications. Furthermore, by omitting the power line communications module and other complex components from the slave terminals, slave terminals may be made much simpler and cheaper than master terminals. The wireless communications module preferably uses a lightweight communications protocol such as 6LoWPAN, further reducing the complexity of the slave terminal. This infrastructure enables a host of technologies, as will be described below.

In a second aspect, the present invention provides a power socket terminal, comprising: at least one power socket, coupled to a power line, for providing power to a device; a switch for turning said at least one power socket on and off; and a wireless communication module, for providing wireless communications.

In a third aspect, the present invention provides a power plug, arranged to be coupled to a device using a power cord, and comprising pins for inserting into a socket of a power socket terminal; the plug further comprising a near-field communication tag, the tag adapted to store device data.

In a fifth aspect, the present invention provides a method of registering a device in a power socket terminal network, the method comprising: inserting a power plug of a device into a power socket of a power socket terminal, the power plug having a near-field communication tag attached thereto, the tag comprising device data; reading said device data, using a near-field communication reader located within the power socket terminal, from the tag; transmitting said data wirelessly to a master terminal; and registering said data in a power socket database.

Further examples of features of embodiments of the present invention are included in the appended claims.

BRIEF DESCRIPTION OF THE DRAWINGS

Embodiments of the present invention will now be described, by way of example only, and with reference to the accompanying drawing, in which.

DETAILED DESCRIPTION OF EMBODIMENTS OF THE INVENTION

Figure 1:
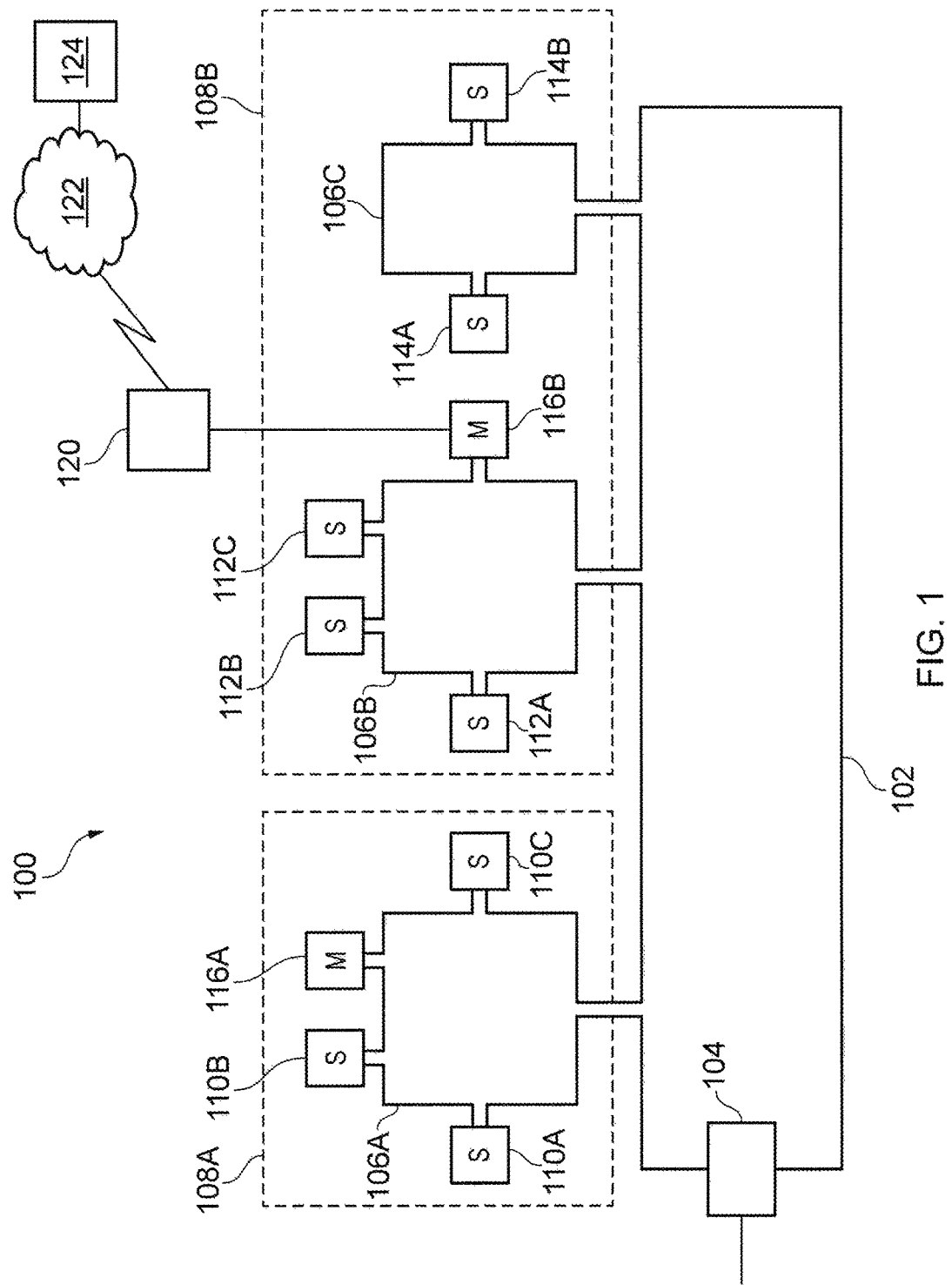
FIG. 1 shows a power socket terminal network in accordance with an embodiment of the present invention.

FIG. 1 shows a power socket control system 100 in accordance with an embodiment of the present invention. The system 100 includes electrical wiring 102, which may be in the form of a ring main. The electrical wiring 102 is coupled to a consumer unit 104 which connects the electrical wiring to a mains electricity supply. In this example, the electrical wiring 102 may be used to supply power to electrical wall sockets in a residential or commercial building. In this example, the electrical wiring is a single wire forming a single ring main. It will be appreciated that in some examples, two or more ring mains may be present.

The electrical wiring 102 is formed into local loops in each of a number of areas. In the present case, the electrical wiring is formed into local loops 106A, 106B and 106C. Local loop 106A is formed in a first room 108A and local loops 106B and C are formed in a second room 108B. Local loop 106A therefore represents a first zone and local loops 106B and 106C represent a second zone.

Local loop 106A couples together a number of wall boxes in first room 108A. Each wall box includes a power socket terminal which is used to supply power to any number of devices in a conventional manner. The power socket terminals are provided in two configurations. Firstly, there are power socket slave terminals. The slave terminals are basic power socket terminals having certain features such as remotely controllable relay switches, a power consumption monitor, an NFC tag reader and wireless communications capabilities. The slave terminals and their features will be described in more detail below. In the present example, local loop 106A includes slave terminals 110A, 110B and 110C; local loop 106B includes slave terminals 112A, 112B and 112C; and local loop 106C includes slave terminals 114A and 114B.

The second type of power socket terminal is the power socket master terminal. Local loop 106A includes power socket master terminal 116A and local loop 106B includes power socket master terminal 116B. The master terminals includes the same features as the slave terminals, but also includes power line communications (PLC) modules, enabling the master terminals to communicate with each other. The master terminals are also arranged to communicate with the slave terminals on a one-to-many basis. As can be seen, each room 108A, 108B includes several slave terminals and one master terminal. The master terminals are arranged to communicate with the slave terminals using wireless technology, as will be described in more detail below.

Master terminal 116B is also connected to router 120 using conventional network cabling. The router 120 connects to the internet 122 in the conventional manner. The system 100 also includes a power control server 124, the details of which will be provided below. In use, the master terminal 116B is arranged to communicate with the server 124, thereby enabling remote storage of information collated in the master terminals, such as power consumption.

Figure 2:
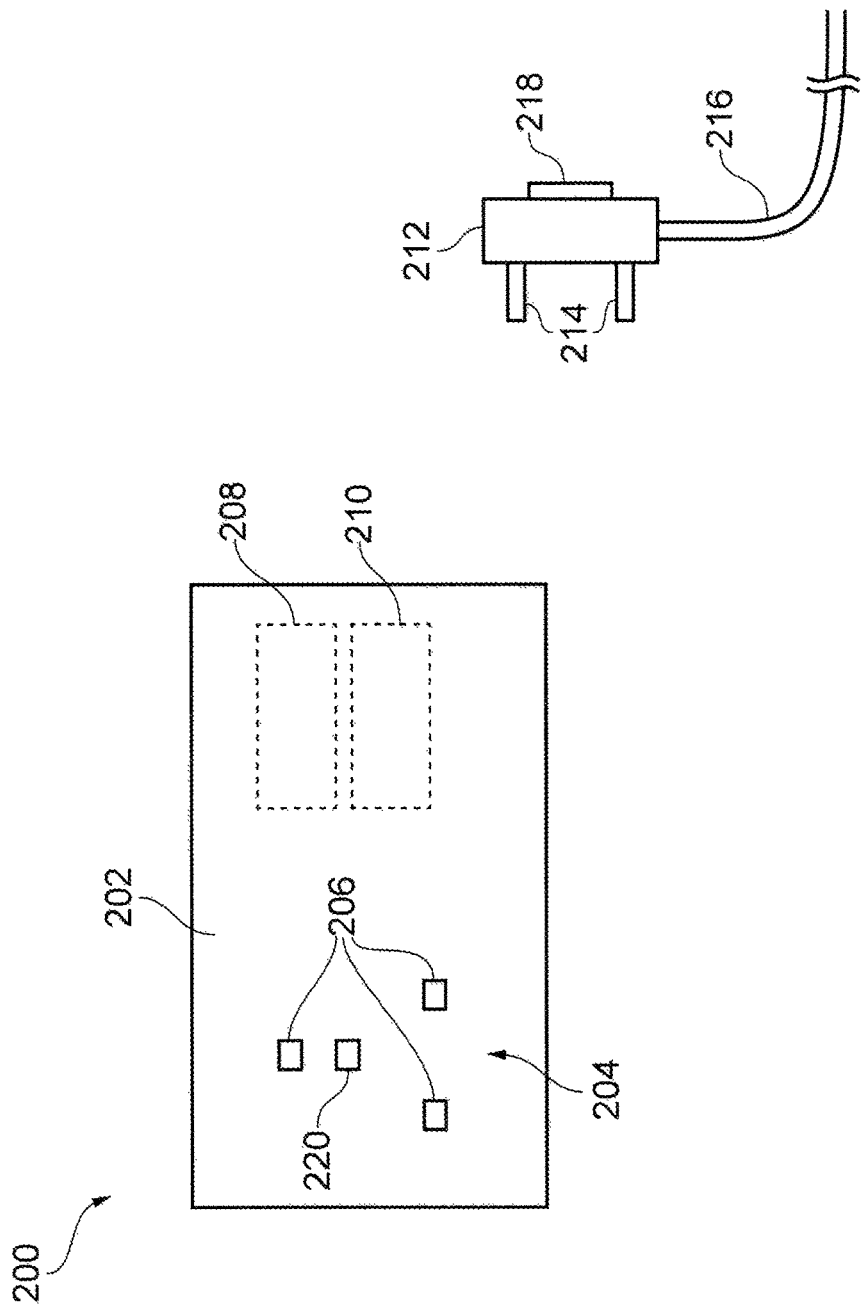
FIG. 2 shows a power socket slave terminal in accordance with an embodiment of the present invention.

FIG. 2 shows a power socket slave terminal 200 in accordance with an embodiment of the present invention. The slave terminal 200 is the same as terminals 110A, 110B, 110C, 112A, 112B, 112C, 114A and 114B. The terminal 200 includes a fascia 202, which includes a power socket 204. In this case, the power socket 204 is a three-hole power socket with the holes 206 arranged in the standard format used in the United Kingdom. Other types of power socket conforming to standard formats in countries other than the UK may be used. The terminal 200 also includes a near-field communication (NFC) reader 208, which is located inside the terminal. The terminal 200 also includes a power consumption monitor 210, which is also located inside the terminal. FIG. 2 also shows a power plug 212, which includes pins 214. The plug 212 is a standard power plug (in this case conforming to UK standards). The plug 212 is connected to a power cable 216, which may be coupled to any suitable device. The plug 212 also includes an NFC tag 218. The NFC tag 218 is arranged to be read by the reader 208 when the plug 212 is positioned in the vicinity of the reader, and in particular when the plug is plugged into the socket 204. The tag 218 may be located on the inside of the plug. Alternatively, the tag 218 may be affixed to the outside of the plug. The tag 218 includes device data including a device ID and a group ID, stored in memory. The power socket slave terminal 200 also includes a proximity sensor 220. Further details of the operation of the terminal 200 and plug 212 will be provided below.

Figure 3:
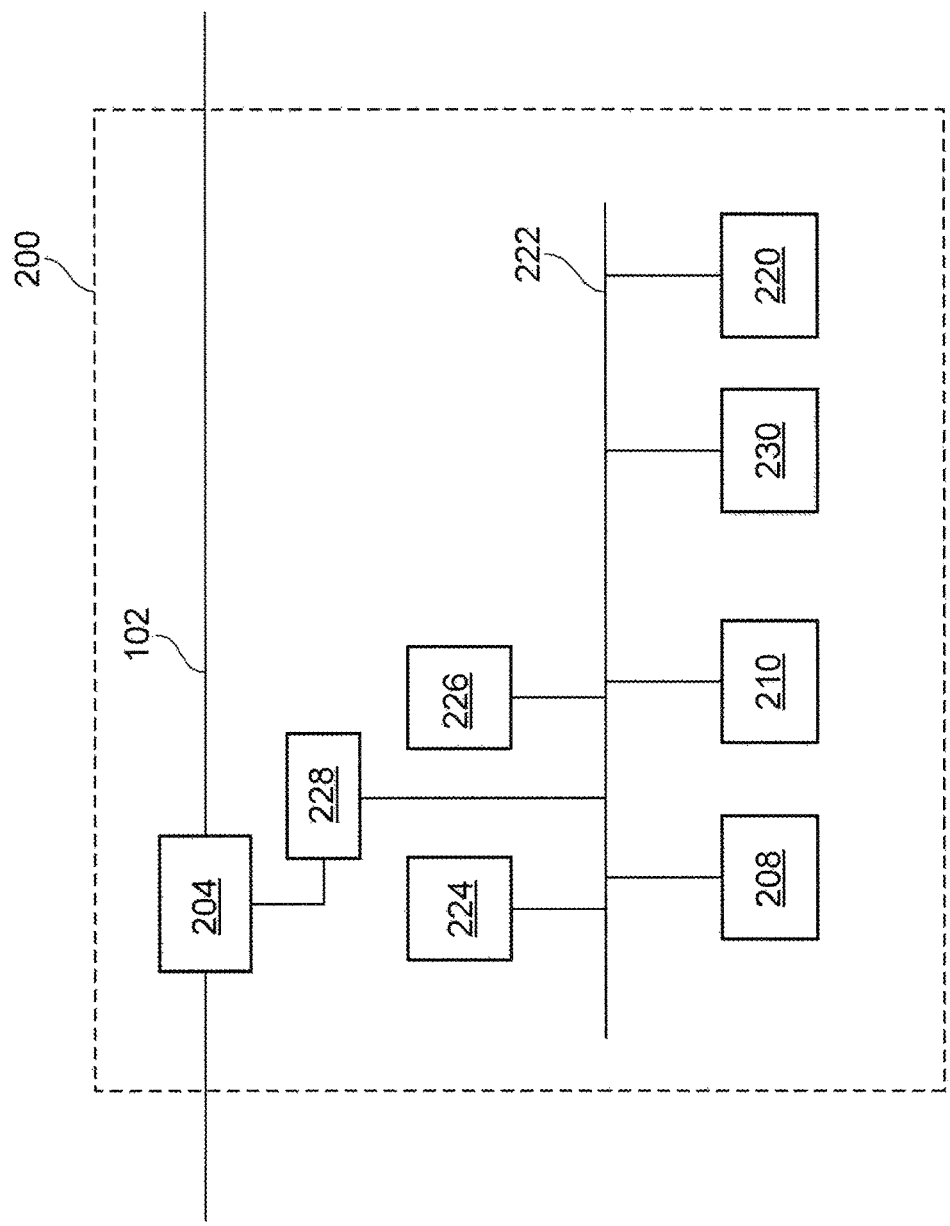
FIG. 3 is a schematic diagram of the circuit of a slave terminal shown in FIG. 2.

FIG. 3 is schematic diagram of the power socket slave terminal 200. The terminal 200 includes the power socket 204 which is coupled to electrical wiring 102. The electrical wiring 102 does not form part of the terminal. Rather, in use, the terminal 200 is coupled to electrical wiring 102, such as local loop 106A, which may be located in the wall of a building. The terminal 200 also includes a data bus 222. The data bus 222 is used to carry data between the various components of the terminal 200. The terminal 200 also includes a central processing unit (CPU) 224 and memory 226. The CPU 224 and memory 226 are also coupled to the data bus 222. The CPU 224 controls the operation of the terminal 200. In addition, the terminal includes the NFC reader 208, power monitor 210 and proximity sensor 220. Each of these elements is coupled to the data bus 222. In addition, the socket 204 includes a relay 228. The relay 228 is for switching the socket 204 on and off. Finally, the slave socket 200 includes wireless module 230, which is arranged to enable the slave terminals to communicate with the master terminals.

The sensor 220 is arranged to determine when a plug 212 is inserted into a socket 204. When the sensor 220 detects the presence of a plug 212, the slave terminal may turn on the socket 204 via relay 228. Conversely, when the sensor 220 detects that a plug 212 has been removed, it may automatically turn off the socket 204. Secondly, the slave terminal 200 may instruct the NFC reader 208 to read the tag 218 which is attached to the plug 212. It will then register the device in the network, and instruct the power monitor 210 to begin monitoring power consumption.

Figure 4:
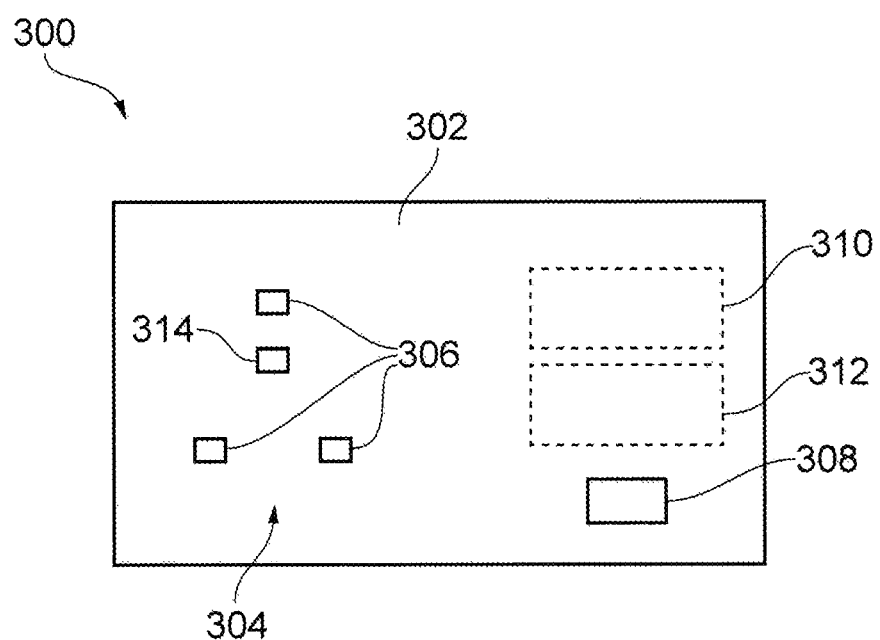
FIG. 4 shows a power socket master terminal in accordance with an embodiment of the present invention.

FIG. 4 shows a power socket master terminal 300 in accordance with an embodiment of the present invention. The master terminal is the same as terminals 116A and 116B. In several respects, the master terminal 300 is the same as slave terminal 200. However, the master terminal 300 includes a number of additional features. The terminal 300 includes a fascia 302, which includes a power socket 304. In this case, the power socket 304 is a three-hole power socket with the holes 306 arranged in the standard format used in the United Kingdom. Other types of power socket conforming to standard formats in countries other than the UK may be used. The fascia 302 also includes a data port 308, such as an Ethernet port. The master terminal 300 also includes a near-field communication (NFC) reader 310, which is located inside the terminal. The master terminal 300 also includes a power consumption monitor 312, which is also located inside the terminal. The master terminal 300 is suitable for use with the power plug 212 shown in FIG. 2. The power socket master terminal 300 also includes a proximity sensor 314. Further details of the operation of the terminal 300 will be provided below.

Figure 5:
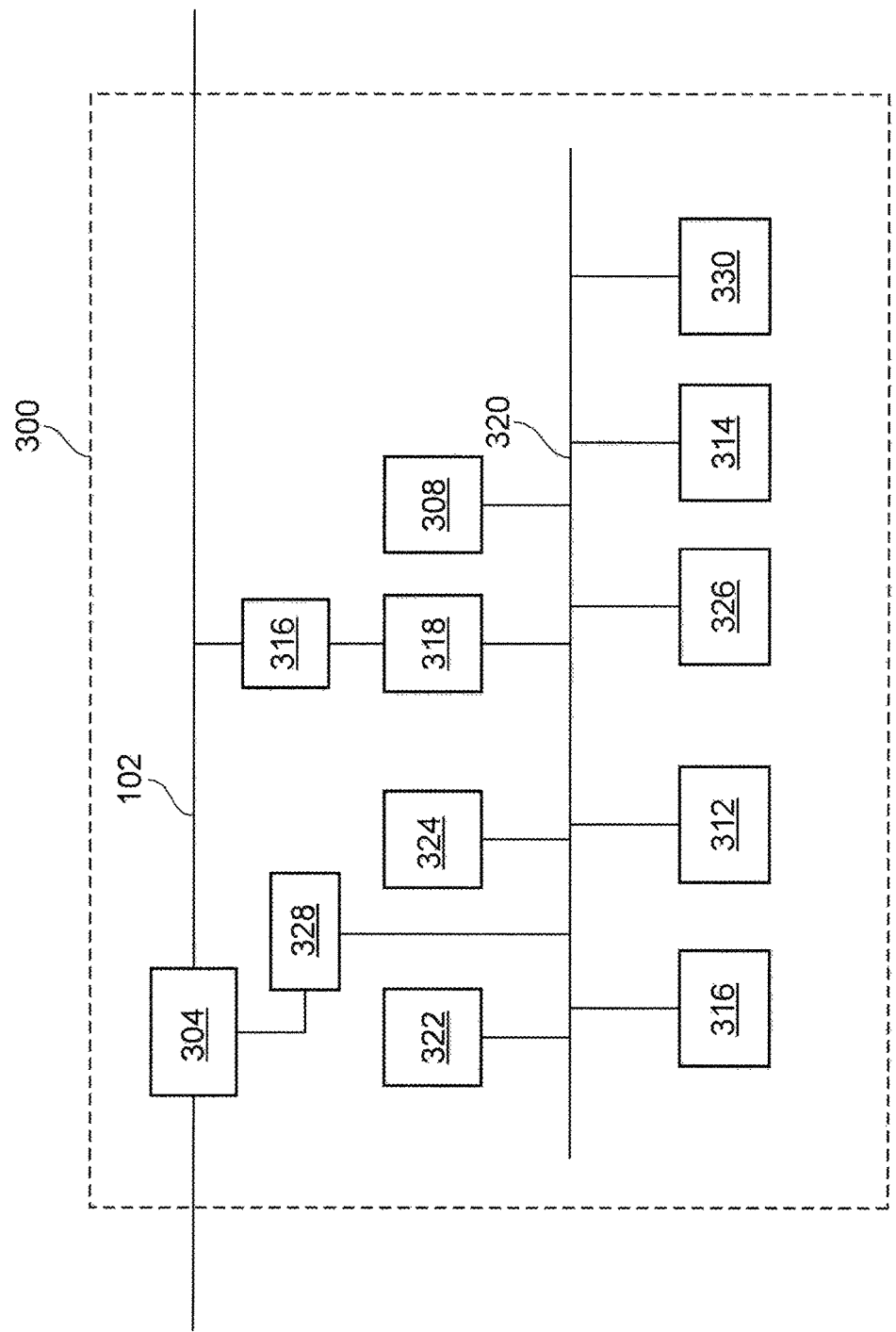
FIG. 5 is a schematic diagram of the circuit of a master terminal shown in FIG. 4.

FIG. 5 is a schematic diagram of the master terminal 300. The master terminal 300 includes the power socket 304 which is coupled to electrical wiring 102. The electrical wiring 102 does not form part of the terminal. Rather, in use, the master terminal 300 is coupled to electrical wiring 102, which may be located in the wall of a building. The master terminal 300 also includes a power line interface 316 and an Ethernet interface 318. The power line interface 316 has a power line processor (not shown) and is coupled to the electrical wiring 102. The power line interface 316 sends and receives signals from the Ethernet interface 318 and transfers them to and from the electrical wiring 102. This enables master terminals 116A and 116B to communicate with each other using PLC. The master terminal 300 also includes a data bus 320. The data bus 320 is used to carry data between the various components of the terminal 300. The terminal 300 also includes a central processing unit (CPU) 322 and memory 324. The CPU 322 may be a twin-core processor. The CPU 322 and memory 324 are also coupled to the data bus 320. The CPU 322 controls the operation of the terminal 300. The terminal 300 also includes the data port 308. In addition, the terminal includes the NFC reader 310, power monitor 312 and proximity sensor 314. Each of these elements is coupled to the data bus 320. The terminal 300 also includes a storage unit 326, which is arranged to store applications and an operating system, for use by the terminal. In addition, the socket 304 includes a relay 328. The relay is controlled by the operating system to switch the socket 304 on and off. The master terminal 300 also includes a wireless communications module 330.

As noted above, the terminal 300 has an operating system stored in storage 326. In use, the processor 322 runs the operating system. The operating system controls the terminal 300, and also communicates with the operating systems present on other master terminals. The operating systems also presents a user interface through which a user may gain access to the master terminal. An example of an operating system suitable for use in the terminal 300 is described in the Applicant's UK Patent Application, GB 2,490,738 A. As noted in GB 2,490,738 A, the operating system presents a communications layer common to all terminals, with one of the terminals acting as a master terminal.

In use, the master terminal 300 is able to communicate wirelessly with each of the slave terminals 110A, 110B, 110C, 112A, 112B, 112C, 114A, 114B, in a one-to-many relationship. This arrangement allows the slave terminals to be less complex and cheaper to manufacturer than the master terminal. Each room may include one master terminal, together with several slave terminals. For example, in FIG. 1, first room 108A represents a first zone including master terminal 116A, and second room 108B represents a second zone including master terminal 116B.

Figure 6:
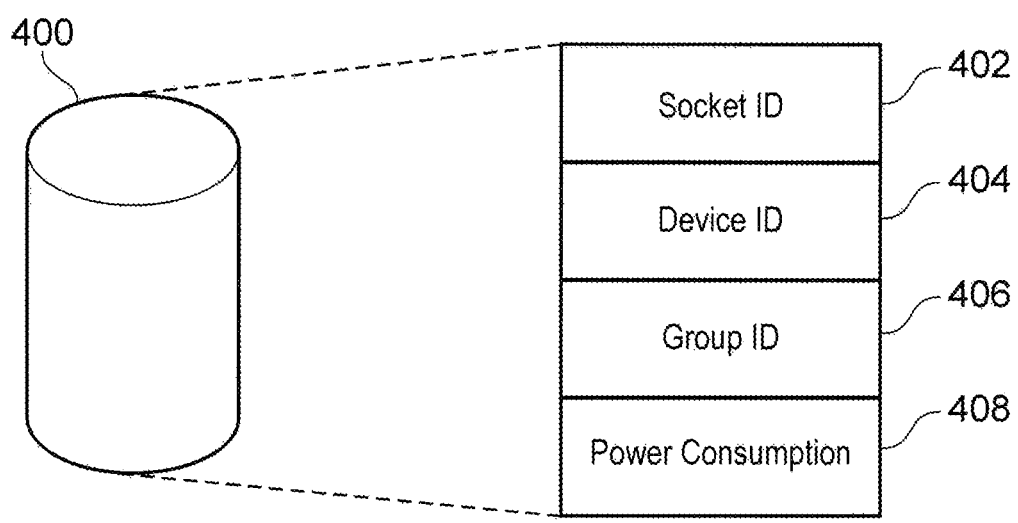
FIG. 6 shows a power socket database for use with the network of FIG. 1.

The master terminal 300 also includes a socket database 400, as shown in FIG. 6. The socket database 400 includes various records relating to the sockets of the power socket slave and master terminals. In particular, each record includes fields including: socket ID field 402, device ID field 404, group ID field 406, and power consumption field 408. The socket database maintains a set of records, shared by the master terminals 116A and 116B, regarding the sockets and devices in the network. This information is passed to the power control server 124, via the Internet. The power control server provides a user of the system with a user interface (not shown). The user interface enables a user to see the information stored in the socket database 400. It also enables the user to remotely control the sockets.

Figure 7:
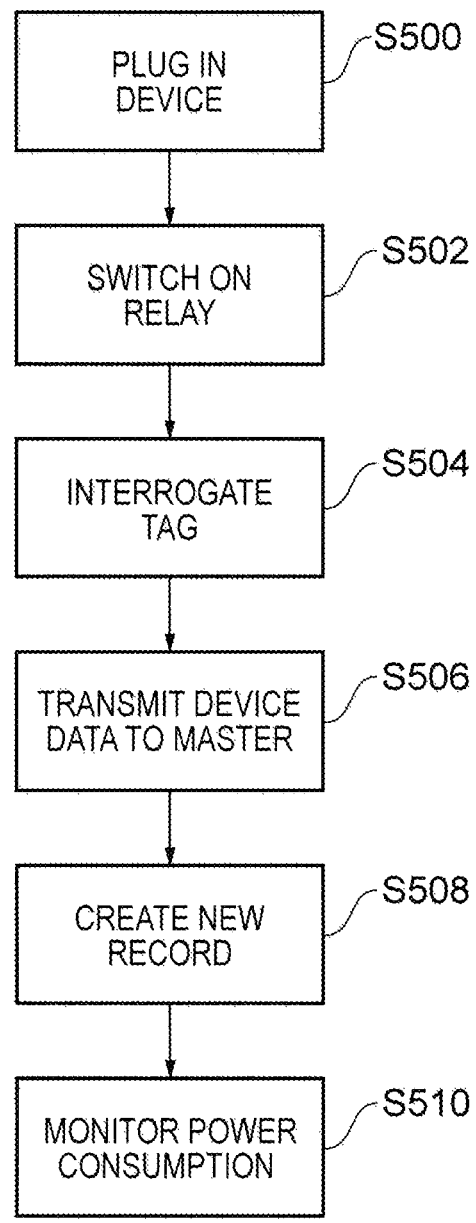
FIG. 7 shows a flow chart of a method in accordance with an embodiment of the present invention.

The operation of the power socket control system 100 will now be described. FIG. 7 shows the process of registering a device that has been plugged into a power socket. When a device requires power, a plug 212, coupled to the device, is plugged into the socket 204 of the slave terminal 200 (S500). In the present example, a device is plugged into socket 204 of slave terminal 110A. The proximity sensor 220 determines that the plug 212 is plugged into the socket 204 and sends a signal to the relay 228 in order to power the device (S502). A signal is also sent to the NFC reader 208 which interrogates the tag 218 (S504). As noted above, the NFC tag 218 has information stored thereon which identifies the device (device ID) which is connected to the plug, as well as device group information (group ID). This information is read by the NFC reader 208. The NFC reader 208 passes this information to master terminal 116A via the wireless module 230. (S506). The master terminal creates a new record for the device in socket database 400 (S508). The record includes the device ID, the group ID and the socket ID. At the same time, the power monitor 210 begins monitoring the power consumption of the device (S510).

The socket database 400 also keeps a record of which devices are associated with which device IDs. This enables the user interface to provide information concerning the device. The device ID itself is unlikely to be useful to the user. Table 1 is an example of entries in the socket database 400.

| Entry | 1 | 2 | 3 |
|---|---|---|---|
| Device ID | 0003 | 0005 | 0012 |
| Device Description | Hair Dryer | Fridge | Router |
| Socket ID | 0012 | 0016 | 0003 |
| Socket Description | Bedroom 2 | Kitchen 1 | Living Room 3 |
| Group ID | 0001 | 0002 | 0003 |
| Group Description | Non-critical | Always on | Preferably on |
| Power consumption | 1000 W | 500 W | 90 W |

Information concerning power usage is collecting and stored so that a historical record may be kept. The user interface presents this information the user. The user interface also enables a user to turn on or off individual sockets. Alternatively, the user may turn on or off groups of sockets using the group designation information. In addition to the aforementioned information, the socket database may store other information such as a) time of use; and b) frequency of use.

Figure 8:
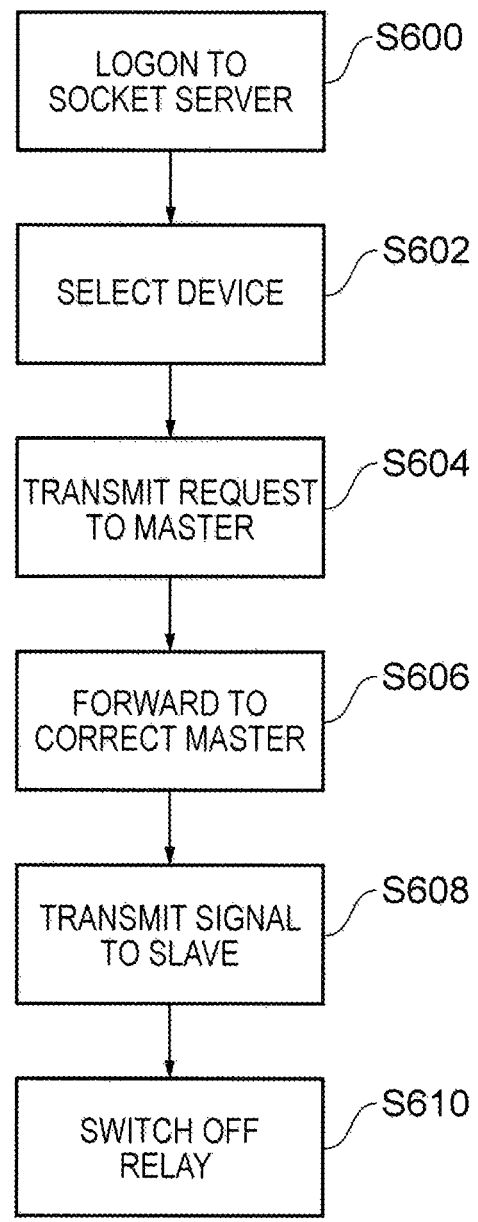
FIG. 8 shows a flow chart of a method in accordance with a further embodiment of the present invention.

The process of turning devices on and off will now be described with reference to FIG. 8. Firstly, when a user wishes to control sockets within the building, they log on to the user interface via the socket control server 124 (S600). The user is then able to view a list of all connected devices, as shown in Table 1. The user interface gives the user the option to turn any individual socket on or off. In this example, the user decides to turn off the hairdryer connected to the socket "Bedroom 2". This socket is identified as slave terminal 110A in the present example. The user selects the necessary option on the user interface (S602). The socket control server 124 sends a signal to master terminal 116B (S604). Master terminal 116B establishes that slave terminal 110A is not part of the second zone (the second room 108B), and sends a signal to master terminal 116A (S606). Master terminal 116A then sends a wireless signal to slave terminal 110A instructing it to close the relay 228 for socket 204 of terminal 110A (S608). The slave terminal 110A then switches relay 228, turning the hairdryer off (S610).

Figure 9:
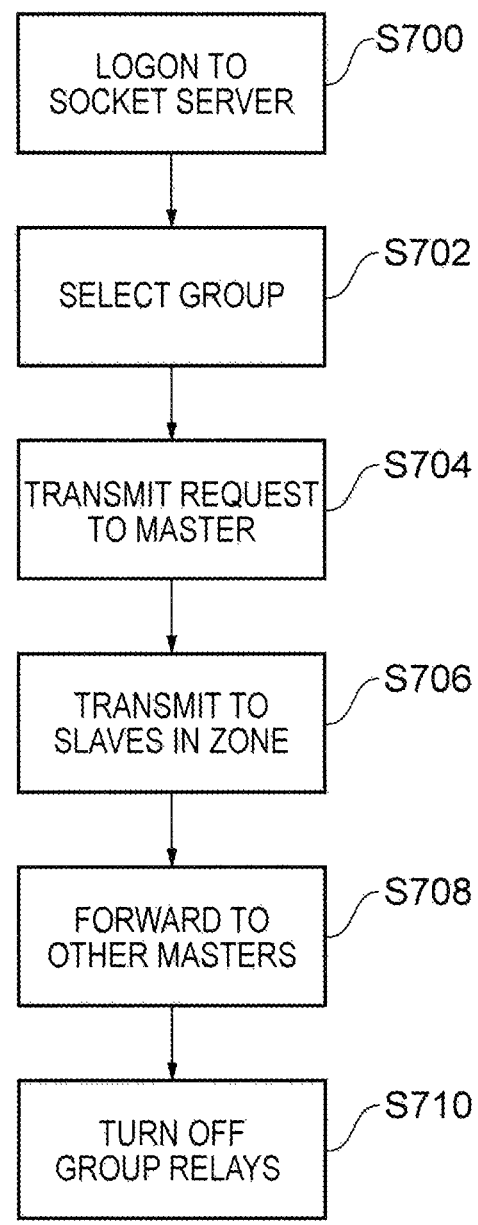
FIG. 9 shows a flow chart of a method in accordance with a further embodiment of the present invention.

The process of turning groups of devices on and off will now be described with reference to FIG. 9. Firstly, when a user wishes to control sockets within the building, they log on to the user interface via the socket control server 124 (S700). The user is then able to view a list of all connected devices, as shown in Table 1. The user interface gives the user the option to turn devices off based on the group designation ID. For example, the user may wish to switch off all "non-critical" devices having group designation ID "0001". In this example, the user decides to turn off the devices having group designation ID "0001". The user selects the necessary option on the user interface (S702). The socket control server 124 sends a signal to master terminal 116B (S704). Master terminal 116B establishes which of the slave terminals have group designation ID "0001" devices connected to them. If any of those sockets are in the second zone (second room 108B), the master terminal 116B makes a wireless connection to those terminals, and instructs them to switch the sockets off (S706). If any of the slave terminals are part of the first zone (first room 108A), the master terminal 116B sends a signal to master terminal 116A (S708). Master terminal 116A then sends a wireless signal to slave terminals in the first zone instructing them to close their relays. The slave terminals then switch their relays, turning the group designation ID "0001" off (S710).

In order to maintain the socket database 400 with up-to-date information, the master terminals 116A, 116B regularly polls all registered sockets for power consumption information. Accordingly, not only is the power consumption data kept up-to-date, but a records of use over time can be maintained.

The process of deregistering a device will now be described. When a device is unplugged from a socket 204, the proximity sensor 220 detects that the plug has been removed, and sends a signal to the master terminal using the wireless module 230. The master terminal then removes the entry for that device from the socket database 400. The historical record is maintained for the user to view at a later date.

The wireless module 230 preferably uses a lightweight wireless protocol such as IPv6 over Low power Wireless Personal Area Networks (6LoWPAN). However, other protocols may be used. It will be understood that all of the features and functions offered by the slave terminals, are also offered by the master terminals. In an alternative embodiment, the slave devices may also include a power line communications module, enabling them to communicate with the master devices using PLC.

As noted above, the NFC tags include information which identifies the device to which the plug is connected. The NFC tags may be programmed using a NFC enabled mobile smart phone. Such a phone may read and write data to an NFC tag. An App, stored on the smart phone, may be used to enable a user to determine what data to write to an NFC tag. The smart phone may write a unique number to a tag, the number representing the device. The operating system stores the numbers, and the devices to which they relate. Alternatively the tags store the identities of the tags themselves. For example, the tag may identify a hairdryer, a coffee machine, an iron, a fridge etc.

The above-described network has particular advantages over prior art systems. In particular, the use of a combination of power line communications and wireless communication to provide area wide network coverage addresses numerous problems that exist with wireless only and power line only networks. For example, the use of simply slave terminals that have basic wireless connectivity reduces the number of components, the complexity, the cost and the heat generated by master-type devices. Furthermore, by maintaining power line communications for master-master communications, high data bandwidth is possible between different zones. In addition, using wireless communications for certain zones avoids the issues that arise when different sockets are on different power line networks. As noted above, this arrangement enables power socket monitoring and control in a particularly efficient and effective manner.

The invention claimed is:

1. A power socket terminal network, comprising:
   a plurality of power socket slave terminals, each having:
      at least one power socket coupled to a power line, for providing power to a device; a switch for turning said at least one power socket on and off; a wireless communication module, for providing wireless communications; and
   a plurality of power socket master terminals, each having:
      at least one power socket coupled to a power line, for providing power to a device; a switch for turning said at least one power socket on and off; a power line communications module, for providing power line communications via said power line; and a wireless communications module, for providing wireless communications; wherein
   said network includes two or more zones, and each zone includes at least one of the plurality of power socket master terminals and at least one of the plurality of power socket slave terminals;
   each of said plurality of power socket slave terminals is arranged to communicate wirelessly, using said wireless communications module, with at least one of said plurality of power socket master terminals; and
   the plurality of power socket master terminals are coupled to a first power line circuit and are arranged to communicate with each other by power line communication.

2. A network according to claim 1, further comprising a second power line circuit, wherein slave and master terminals in the same zone are coupled to different power line circuits.

3. A network according to claim 1, wherein said switches are remotely controllable, and said plurality of master terminals are arranged to control said plurality of slave terminals' switches to turn said power sockets on or off.

4. A network according to claim 1, wherein said wireless communication uses a lightweight wireless communications protocol.

5. A master power socket terminal network including two or more zones, comprising:
   at least one power socket, coupled to a power line, for providing power to a device;
   a switch for turning said at least one power socket on and off;
   a power line communications module, for providing power line communications via said power line; and
   a wireless communication module, for providing wireless communications, wherein the master power socket terminal is coupled to a first power line circuit and is arranged to communicate with one or more other master terminals coupled to the power line circuit by power line communication, and further arranged to communicate with a plurality of slave terminals, using said wireless communications module.

6. A terminal according to claim 5, further comprising a plug detector; arranged to detect when a plug is inserted into said at least one socket.

7. A method of controlling power sockets in a power socket terminal network, the power socket terminal network comprising:
   a plurality of power socket slave terminals;
   a plurality of power socket master terminals arranged to communicate with each other by power line communication, and
   two or more zones, each zone including at least one of said plurality of power socket master terminals and at least one of said plurality of power socket slave terminals,
   the method comprising:
   selecting, using a user interface, one or more power socket slave terminals to switch on or off;
   transmitting wirelessly, via one or more of said plurality of master terminals, a signal to one or more power socket slave terminals, to turn one or more switches on or off; and
   switching said switches on or off.

* * * * *